United States Patent
Silvano de Sousa et al.

(10) Patent No.: US 10,883,769 B2
(45) Date of Patent: Jan. 5, 2021

(54) HEAT PIPE AND METHOD TO EMBED A HEAT PIPE IN A PRODUCT

(71) Applicant: AT&S Austria Technologie & Systemtechnik Aktiengesellschaft, Leoben (AT)

(72) Inventors: Jonathan Silvano de Sousa, Vienna (AT); Bernhard Reitmaier, Moederbrugg (AT); Michael Polic, Leoben (AT); Gerhard Maringer, Knittelfeld (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/372,781

(22) Filed: Dec. 8, 2016

(65) Prior Publication Data
US 2017/0167799 A1 Jun. 15, 2017

(30) Foreign Application Priority Data
Dec. 14, 2015 (EP) .................................... 15199813

(51) Int. Cl.
*H05K 7/20* (2006.01)
*F28D 15/02* (2006.01)
(Continued)

(52) U.S. Cl.
CPC ........ *F28D 15/0275* (2013.01); *F28F 21/085* (2013.01); *H05K 1/0206* (2013.01);
(Continued)

(58) Field of Classification Search
CPC .... F28D 15/02; F28D 15/0275; F28D 15/046; H05K 1/0203; H05K 1/0204;
(Continued)

(56) References Cited

U.S. PATENT DOCUMENTS 3,680,189 A * 8/1972 Noren .................... B21D 53/02
165/104.26
5,725,050 A * 3/1998 Meyer, IV .......... F28D 15/0266
165/104.33
(Continued)

FOREIGN PATENT DOCUMENTS

JP 2000-138485 A 5/2000

OTHER PUBLICATIONS

European Search Report issued in Application No. 15199813.5, dated Jun. 15, 2016 (10 pages).

*Primary Examiner* — Roshn K Varghese
(74) *Attorney, Agent, or Firm* — Eversheds Sutherland (US) LLP

(57) ABSTRACT

A heat pipe (10) for cooling an electronic device, especially a component carrier (100), that comprises a central section (13) with a cavity (12) filled with a heat transfer fluid (20). In longitudinal direction (11) of the heat pipe (10) directly connected with the central section (13) are a first end section (14) on a first end of the central section and a second end section (15) on the opposite second end of the central section, wherein the first end section and the second end section each comprise a landing structure (17) with a surface length (SL, $SL_1$, $SL_2$) and a surface width (SW, $SW_1$, $SW_2$) and wherein each landing structure is thermoconductively coupled with the central section of the heat pipe. A component carrier comprising at least one heat pipe for cooling it, and a method for producing the component carrier are also provided.

21 Claims, 4 Drawing Sheets

(51) Int. Cl.
*F28F 21/08* (2006.01)
*H05K 1/02* (2006.01)
*H05K 3/46* (2006.01)
*F28D 21/00* (2006.01)

(52) U.S. Cl.
CPC ........... *H05K 3/46* (2013.01); *H05K 7/20336* (2013.01); *H05K 7/20345* (2013.01); *F28D 2021/0028* (2013.01); *H05K 2201/064* (2013.01)

(58) Field of Classification Search
CPC ............... H05K 1/0206; H05K 1/0207; H05K 7/20336; H05K 7/20663; H05K 2201/064; H05K 7/2029; H05K 7/205; H05K 2201/06; H01L 23/427
USPC ...................................... 174/252; 361/679.52
See application file for complete search history.

(56) References Cited

U.S. PATENT DOCUMENTS

| 5,960,866 | A | * | 10/1999 | Kimura | F28D 15/0233 165/104.19 |
| 6,152,213 | A | * | 11/2000 | Suzuki | F28D 15/0241 165/104.26 |
| 8,506,135 | B1 | * | 8/2013 | Oster | F21V 29/006 362/218 |
| 2003/0019103 | A1 | * | 1/2003 | Sagal | B29C 45/14622 165/104.17 |
| 2004/0069460 | A1 | * | 4/2004 | Sasaki | F28D 15/0241 165/104.26 |
| 2004/0069462 | A1 | | 4/2004 | Hashimoto | |
| 2005/0045310 | A1 | * | 3/2005 | Okutsu | F28D 15/0233 165/80.3 |
| 2006/0012034 | A1 | * | 1/2006 | Kadoya | H05K 1/0203 257/712 |
| 2007/0068657 | A1 | * | 3/2007 | Yamamoto | F28D 15/0233 165/104.26 |
| 2008/0087456 | A1 | | 4/2008 | Schuette | |
| 2009/0065180 | A1 | * | 3/2009 | Wits | F28D 15/0233 165/104.26 |
| 2010/0321888 | A1 | | 12/2010 | Yamaguchi et al. | |
| 2012/0211203 | A1 | * | 8/2012 | Chang | F28D 15/0233 165/104.26 |
| 2016/0095197 | A1 | * | 3/2016 | Lee | H05K 1/0272 361/700 |

* cited by examiner

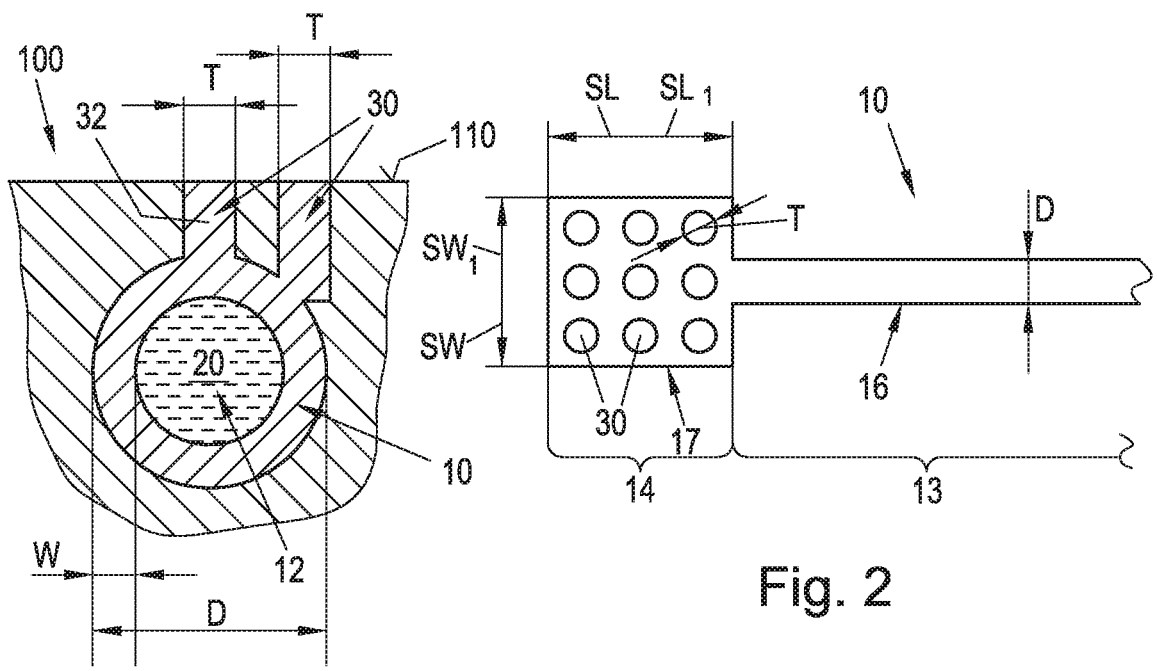
Fig. 1
Fig. 2
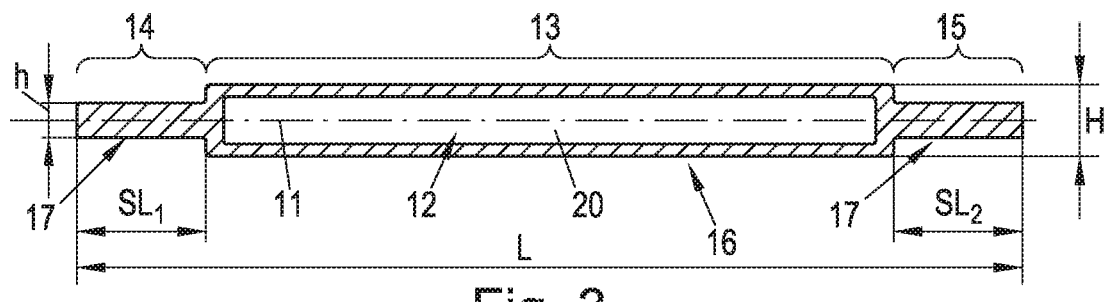
Fig. 3
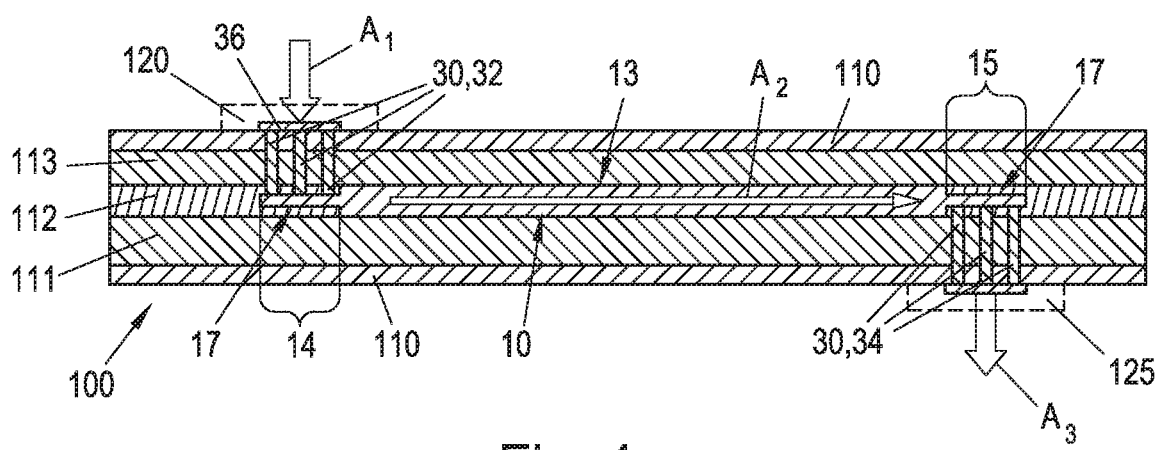
Fig. 4

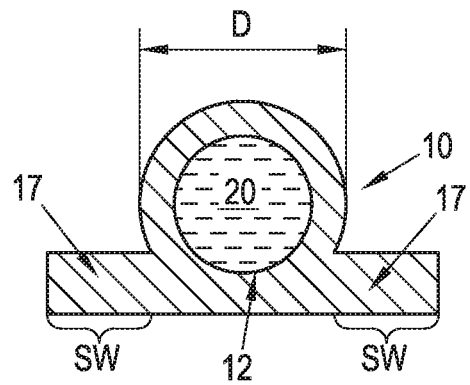 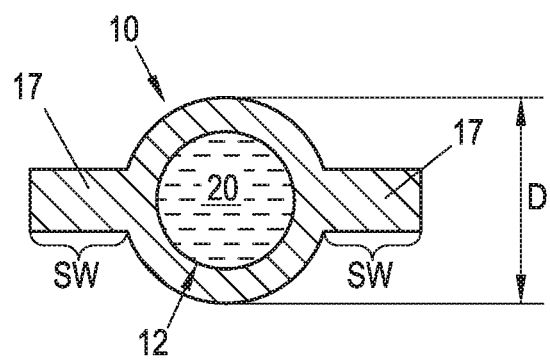
Fig. 9    Fig. 10
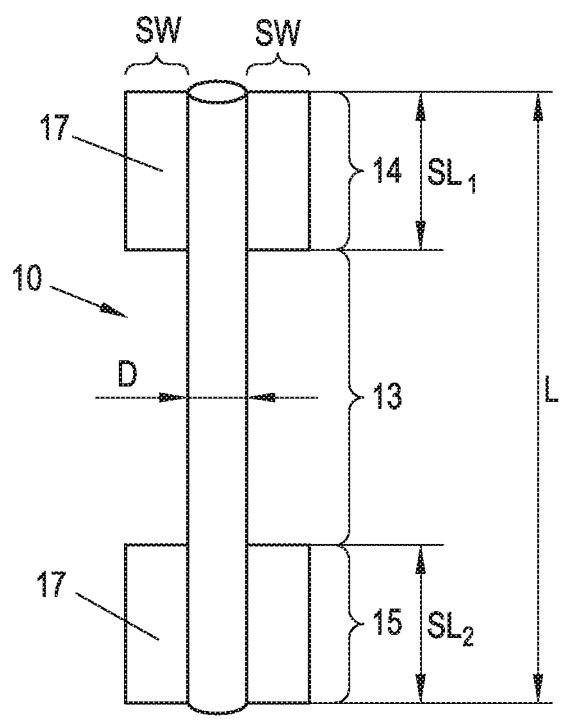 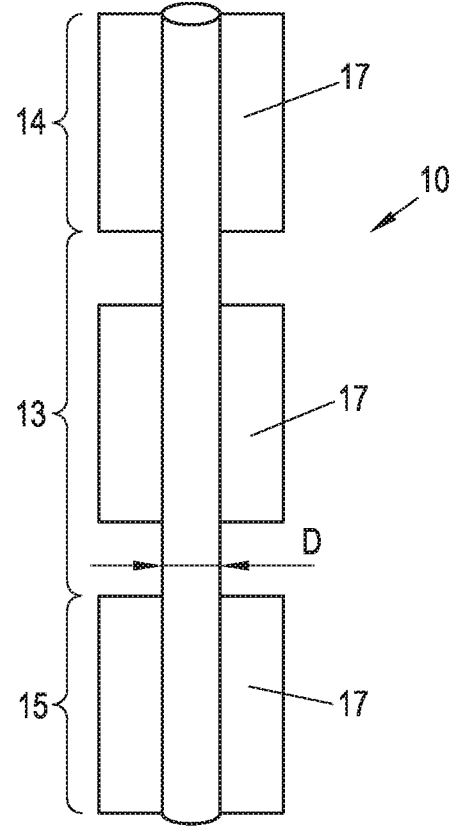
Fig. 11    Fig. 12

HEAT PIPE AND METHOD TO EMBED A HEAT PIPE IN A PRODUCT

The invention relates to a heat pipe for cooling an electronic device, especially a component carrier, comprising a central section with a cavity filled with a heat transfer fluid. The invention also relates to a component carrier comprising at least one heat pipe for cooling it, as well as to a method for producing said component carrier. The heat pipe according to the invention is applicable to, but not just limited to electronic devices like a component carrier, for example a printed circuit board, an intermediate printed circuit board product or an IC-substrate, wherein the at least one heat pipe is embedded for appertaining cooling of heat-dissipating electronic components.

A heat pipe is a heat-transfer device that combines the principles of both thermal conductivity and phase transition to efficiently manage the transfer of heat between two solid interfaces. In general heat pipes are shaped as sealed pipes or tubes and are commonly made of a material that is compatible with the working fluid such copper for water filled heat pipes. Thus heat pipes enhance the heat transfer essentially one-dimensionally along their length between the two interfaces that are spaced from each other in longitudinal direction of the heat pipe. At a hot interface of the heat pipe a heat transfer fluid like a liquid that is in contact with a thermally conductive solid surface turns into a vapour by absorbing heat from that surface. The heat transfer fluid is housed within a cavity of the heat pipe that is usually an encapsulated, closed hollow space to avoid any losses of the heat transfer fluid. The vapour then travels along the heat pipe to a cold interface and condenses there back into a liquid by release of the latent heat. The liquid then returns to the hot interface through either capillary action, centrifugal force, or gravity, and the cycle repeats.

Nowadays flattened or planar heat pipes are commonly used in the industry to improve the thermal management performance of electronic devices. For example documents WO 2007/096313 A1 as well as WO 2010/121230 A1 both refer to planar heat pipes for cooling. Usually these heat pipes are conceived in cylindrical structures that are flattened during the heat pipe fabrication process.

Document JP 2000-138485 A discloses a printed circuit board with a heat pipe for cooling electronic components. The heat pipe is integrally formed in a ground plane of one internal metal layer while PCB manufacture, wherein two sheets of copper plates are pressed together in a way that these two compressed copper plates form a ground plane layer with a cavity that is afterwards filled with a coolant. Disadvantageously the position of this integrally formed heat pipe is predefined by the arrangement of the ground plane metallic layer within the PCB layers. Thus the electronic components are mounted sidewise in a distance to the heat pipe. Also the manufacture of these heat pipes is costly and further enhances thermal stress for the PCB setup as the copper plates have to be pressed together in situ during PCB manufacture. Afterwards resin layers have to be formed on both sides of the bonded copper plates and finally coolant has to be filled into the cavity before it has to be sealed on site during manufacture to provide a heat pipe that is integrated within the ground plane layer. Thus this integrated heat pipe only functions if all aforesaid manufacturing steps have been taken while PCB manufacture.

Modern heat pipes are small enough to be embedded in a printed circuit board (short: PCB) structure. Nevertheless, the maximum temperature range for assembly and operation of these heat pipes has to be kept below 140° C. in order not to destroy the heat pipe's flat shape, as an increase of the internal pressure will deform the heat pipe into a cylindrical shape. Disadvantageously this can lead to total failure of the PCB under extreme temperature conditions. Therefore, flattened heat pipes known in the art cannot be assembled on a bare PCB, because high temperatures up to 280° C. that are required for surface mount technology (short: SMT) assembly as well as temperatures up to 250° C. that are required for the subsequent reflow cycles would destroy or at least deform the heat pipes. For that reason, cylindrical heat pipes that are robust in regard to extreme temperature changes are preferred for the embedding process within a PCB.

In regard to the aforesaid requirements for embedding components: As the heat pipe disclosed in JP 2000-138485 A is no single separate part, but is formed layer-wise during PCB manufacture, it cannot be embedded in a PCB structure, at least not as an already operational heat pipe that is filled with a coolant or fluid for heat transfer.

Document U.S. 2008/0087456 A1 refers to a circuit board assembly containing a flat heat spreader that serves as electrical ground plane for assemblies. Disadvantageously a heat spreader dissipates heat over its entire geometry, hence at least in two dimensions. Thus, heat spreaders or vapour chambers, respectively, principally differ from a heat pipe that has the advantage to enhance the heat transfer in one particular dimension. Furthermore the aforesaid drawbacks are likewise valid for a heat spreader which therefore cannot be embedded in a PCB structure, at least not as an already operational heat spreader that is filled with a coolant or fluid for heat transfer.

It has been found out by the applicant that cylindrical heat pipes can undergo this thermal stress without any reliability risks. Modern cylindrical heat pipes can be as thin as 1 mm in diameter—or even thinner. The challenge that rises in this situation is to properly contact the heat pipes with thermal vias like copper filled vias which are common in PCB technology. The non-planar but cylindrical surface and out shape, respectively, of the heat pipes can create problems in safely connecting the thermal vias all-over their total cross sectional area to the surface of the heat pipes to ensure a satisfying heat dissipation ability.

Thus an object of the present invention is to provide an improved heat pipe product that is robust and can withstand high thermal stress, in unison is thin enough in order to be able to be embedded and thermally—and as an option also electrically—connected to a conductive network of a PCB and that provides enhanced heat dissipation capacity when connecting thermal vias to the surface of the respective heat pipe. Furthermore the improved heat pipe product shall be a single separate part that is already operational when being embedded.

In this context another object of the present invention is to enhance the reliability of said heat pipe product at reflow conditions at temperatures up to 250° C. Thus the aim is to avoid usage of materials like solder that suffer phase change or the problem of gas release under subsequent reflow process conditions.

Another, more specific object of the present invention is to provide an improved component carrier like a PCB, an intermediate printed circuit board product or an IC-substrate, comprising at least one heat pipe for cooling it, wherein—compared with a known PCB that contains one or several heat pipes—the heat dissipation capacity is enhanced and contact areas to safely connect thermal vias to the heat pipe are arranged in a way to ensure a proper thermal connection between the thermal vias and the heat pipe.

In this context the term "substrate" can be understood as carrier for electrical connections or electrical networks as well as component carrier comparable to a printed circuit board (PCB), however with a considerably higher density of laterally and/or vertically arranged connections. Lateral connections are for example conducting paths, whereas vertical connections might be for example drill holes. These lateral and/or vertical connections are arranged within the substrate and are commonly used to provide electrical and/or mechanical connections of components or surrounded components, particularly of IC chips, with a printed circuit board or intermediate printed circuit board. Thus the term "substrate" also includes so-called "IC substrates".

A further object of the present invention is to provide a method for producing a component carrier with at least one embedded heat pipe, wherein the feasibility to safely connect thermal vias to the embedded heat pipe is improved and the amount of PCB rejects due to inadequate thermal conduction between thermal vias and the embedded heat pipe is greatly reduced.

In this context the term "component" can be understood as electronic component or electronic chip, respectively. Each active electronic component like a chip, especially a semiconductor chip, or each passive electronic component like a condenser, a resistor, an inductivity or a magnetic element like a ferrite core element, can be a component. Further examples for electronic components that can be embedded within or positioned upon a component carrier are data storage devices like a dynamic random access memory (DRAM), filters that can be configured for example as high-pass filter, low-pass filter or band-pass filter or that can be used as frequency filters. Also an integrated circuit (IC) like a so-called logic IC, any signal processing component like a microprocessor, any performance management component, any opto-electronic device, any voltage converter like DC/DC-converter or AC/DC-converter, any electromechanical converter like a lead-zirconium titanate (PZT)-sensor and/or -actor, as well as any sender unit or receiving unit for electromagnetic waves like a RFID-chip or -transponder, any cryptographic component, capacity, inductivity or switch like a transistor-based switch are comprised alone or combined with the aforementioned or together with other functional electronic components by the aforesaid term of a component or an electronic component, respectively. Furthermore the electronic component can also comprise a microelectromechanical system (short MEMS), a battery, an accumulator, a camera or an antenna.

Also another task of the invention is to improve the heat management of a component carrier comprising a heat pipe and to increase the heat absorption capability of the heat pipe.

The afore-mentioned objects are solved within the present invention by providing a heat pipe according to the preamble of claim 1 with the features of the characterizing part of claim 1.

According to the invention a heat pipe for cooling an electronic device, especially a component carrier, comprising a central section with a cavity filled with a heat transfer fluid, comprises a first end section, that is in longitudinal direction of the heat pipe directly connected with a first end of the central section and further comprises a second end section, that is directly connected on the opposite second end of the central section, wherein the first end section and the second end section each comprise a landing structure with a surface length and a surface width and wherein each landing structure is thermoconductively coupled with the central section of the heat pipe.

The landing structures on the first end section as well on the second end section each enhance the possibility to safely connect thermal vias all-over their total cross sectional area to the surface of the heat pipes in the region of the landing structures that have no cavity filled with a heat transfer fluid. Thus by means of the landing structures a satisfying heat dissipation ability of the heat pipe is ensured when being thermoconductively coupled and contacted with thermal vias and by means of thermal vias further connected with electronic components, respectively.

Advantageously due to the landing structures arranged on the end sections this inventive heat pipe can be introduced directly in the core of a printed circuit board (PCB) contacting relevant areas within the PCB where efficient heat transport is required. Of course one or more inventive heat pipes can also be embedded in coreless PCB's.

The small dimensions of the heat pipe that can be manufactured with diameters of 1 mm or even below with diameters in the micrometre-scale will allow the heat pipe to be designed for mobile devices or comparable electronic devices with strict spatial restrictions. Thus there is no need of a chassis mount for the inventive heat pipe as it is nowadays required for heat pipes known in the art to be integrated in smartphones or tablet computers.

The connection of the end sections and the central section of a heat pipe according to the invention can be manufactured in various ways: For example a standard heat pipe that comprises a cavity can be taken as central section, whereby a first end section and a second end section that each comprise landing structures are for example attached to the central section either by an interlocking connection like a plug connection, or by a firmly bonded connection like a welded, glued or soldered connection.

Another possibility to manufacture a heat pipe according to the invention can be as if made from one piece, wherein for example the end sections that enlarge the central section in longitudinal direction are each made of the same material. For instance this material can be a solid metal material like solid copper as is the case of the wall material used in the central section to surround and encapsulate the filled cavity.

Preferably the landing structures can be used for direct galvanic connection of the heat pipe to the PCB or respective layers of the component carrier. Especially for embedding purposes, materials that are not suitable for the temperatures and conditions applied during reflow processes have to be avoided. Thus for example soldering of the landing structures to contact the heat pipe has to be avoided as solder materials suffer phase change and the problem of gas release under subsequent reflow process conditions.

Even another possibility to design a heat pipe according to the invention is to manufacture the both end sections as well as the central section in one piece. Clearly also in this case of a single-piece heat pipe the end sections and the central section are directly connected with each other.

In these aforesaid cases landing structures that are arranged on the end sections made of solid copper can either have the contour and outer shape of the central section, or the surface areas of the landing structures themselves can be enlarged by pressing or flatting these end sections accordingly. As a particularly advantageous example a heat pipe according to the invention can be manufactured by providing a single-piece heat pipe with elongated end sections made of solid copper that are further enlarged by pressing and flatting these end sections to provide respective flattened landing structures on the end sections.

Advantageously the heat pipe according to the invention can further comprise at least one landing structure that is directly connected and thermoconductively coupled with the central section. Thus the heat pipe can for example also be connected via a landing structure along its central section by a heat source and the heat can be dissipated via landing structures on both end sections. In this configuration, the heat pipe comprises for example three landing zones: one in the central section and two on the end sections of the heat pipe.

In a further suitable embodiment of the invention the at least one landing structure of the heat pipe can adjoin and/or laterally protrude along at least one longitudinal segment of the central section and/or first end section and/or second end section. Thus the one or several landing structures that are arranged along at least one or several longitudinal segments of the central section advantageously also enlarge the surface area of the heat pipe.

In a preferred embodiment of the invention at least one landing structure of the heat pipe can be electrically coupled with the central section of the heat pipe. Advantageously the heat pipe can be thermally and electrically connected and/or galvanically coupled to the copper network of a PCB.

Advantageously the heat pipe according to the invention can be designed in a way that the first end section and/or the second end section is or are, respectively, firmly bonded with the central section of the heat pipe. Firmly bonding of the end sections to the central section of the heat pipe enhances also the mechanical stability of the heat pipe and ensures a force-fitted connection of the end sections with the central section of the heat pipe.

In a further practical embodiment of the invention the heat pipe can be carried out that the central section and/or the first end section and/or the second end section has or have, respectively, a cylindrical profile with an outer diameter of the heat pipe.

Advantageously the heat pipe according to the invention can comprise a first end section and/or a second end section that is or are, respectively, made of a solid metal, preferably made of a solid copper or solid copper alloy.

Cylindrical heat pipes are able to survive the thermal stress a PCB undergoes when high temperatures required for surface-mount-technology (SMT) steps are applied. To overcome the weak points of a cylindrical profile and concomitant rounded outer surface of the heat pipe that can minimize its thermal connection to a hot spot and also can minimize the mechanical stability of the connected thermal vias, the landing structures of the heat pipes are made of solid metal, preferably made of solid copper or solid copper alloy.

Usefully in an alternative embodiment of the invention the heat pipe comprises a first end section and/or a second end section that is or are, respectively, flattened, wherein the height of the flattened landing structure is smaller than the total height or diameter of the central section of the heat pipe and wherein the surface width of the flattened landing structure is greater than the total height or diameter of the central section of the heat pipe.

According to the invention for example a cylindrical heat pipe which can be embedded and at least thermally connected to the copper network of a PCB, flattened landing structures on the heat pipe that are not filled with gas or fluid enhance the comfort and safety to securely contact the heat pipe with thermal vias. These flattened landing structures are merely made to enlarge the surface area of the heat pipe without below fluid-filled cavity and to make the thermal via connection possible and efficient with the heat pipe.

Thus pressing the ends of a conventional heat pipe does not provide said flattened landing structures. On the one hand the reliability during reflow processes would be dramatically reduced of such heat pipes that are endwise flattened by pressing. Under increased internal vapour pressure of the heat transfer fluid the pressed-together end sections would open out and allow fluid or vapour, respectively, re-enter internally into the formerly pressed end sections of the heat pipe. Which would result in contact problems as mechanical drilling of the pressed end sections would perforate the heat pipe and destroy it. On the other hand wick structures that may be used within conventional heat pipes and that may include for example sintered metal powder do not allow a perfectly flat surface of pressed end sections of such a heat pipe. Any deviation from a planar-pressed end section that is not perfectly sealed against the fluid-filled cavity, would result in possible failure of the heat pipe and furthermore in a failure of the respective component carrier wherein said heat pipe is integrated.

The aforesaid tasks are also solved within the present invention by providing a component carrier with the features of claim 9.

A component carrier according to the invention comprising at least one aforesaid heat pipe is carried out in a way that the at least one heat pipe is embedded within at least one inner layer of the component carrier, which at least one inner layer is arranged between outside surface layers forming the outside surface of the component carrier, and wherein each landing structure of the embedded heat pipe is thermoconductively coupled by means of at least one thermal via to at least one outside surface of an outside surface layer of the component carrier. The layers of the component carrier can be conductive layers as well as isolating layers. By way of example conductive layers and isolating layers can be arranged alternately to form a multi-layer component carrier.

The aforesaid advantages of a heat pipe apply equivalently also for a component carrier, like for example a PCB, an intermediate printed circuit board product or an IC-substrate. Due to the landing structures that are directly connected with the central section of the heat pipe and that have no cavity filled with a heat transfer fluid below, it is possible to realise thermal via structures on the landing structures and to easily and securely contact several layers and/or components of the component carrier with the at least one embedded heat pipe. Another advantage is that the thermal cross-section of the heat pipe is increased. Thus there will be less thermal impedance between a device to be cooled like a heat-dissipating electronic component and the heat pipe and also between a heat sink and the heat pipe, respectively.

In a further development of the invention the component carrier comprises at least one thermal via that contacts a landing structure of the heat pipe on its surface or that ends within the landing structure or that passes through the landing structure. Thus components that are positioned on outside surfaces as well as components that are embedded within the component carrier can advantageously be connected via thermal vias with one or more landing structures of the heat pipe.

Advantageously the component carrier according to the invention is designed in a way that each landing structure is electrically coupled and/or galvanically coupled by means of at least one thermal via to at least one outside surface of an outside surface layer.

In a further preferred realisation of the invention the component carrier further comprises at least one heat-dissipating component and at least one heat-releasing component, wherein the at least one heat-dissipating component is mounted on an outside surface layer or is embedded within at least one inner layer and contacted directly or by means of at least one thermal via to a landing structure of the first end section and/or central section and/or the second end section of the embedded heat pipe and wherein a landing structure of the second end section and/or central section of the heat pipe is contacted directly or by means of at least one thermal via to the at least one heat releasing component which is mounted on an outside surface layer or is embedded within at least one inner layer.

Depending on the particular application of the component carrier like for example an intermediate printed circuit board product, heat-dissipating electronic components, so-called heat sources, as well as heat releasing components, so-called heat sinks, can be mounted on outside surfaces of the component carrier and/or be embedded within inner layers of the respective component carrier, PCB product and IC-substrate, respectively.

To cool the at least heat-dissipating electronic component a heat input flow from the electronic component into the component carrier can be conducted via the thermal vias—like copper-filled vias or plated through holes—to the first end section and further to the central section of the heat pipe, wherein the heat is further conducted via the heat transfer fluid within the cavity to the second end section. At the second end section the heat is conducted via the thermal vias to the outside surface layer of the component carrier and is then released via the at least one heat releasing component into the surroundings of the component carrier like an intermediate printed circuit board.

In another convenient development of the invention the component carrier can be designed in a way that the at least one heat-dissipating component is contacted directly or by means of at least one thermal via to a landing structure of the central section of the embedded heat pipe and wherein heat releasing components are contacted by means of thermal vias to landing structures of the first end section and/or second end section of the heat pipe.

Thus the embedded heat pipe can for example also be connected via a landing structure along its central section by a heat source and the heat can be dissipated via landing structures on both end sections. In this configuration, the heat pipe comprises for example three landing zones: one in the central section and two landing structures, one on each end section of the heat pipe.

The objects of the current invention are also solved by providing a production method for a component carrier with the features of claim 14.

According to the invention a method for producing a component carrier with at least one embedded heat pipe, comprises the following steps:

-a- Providing at least one heat pipe according to the invention, which at least one heat pipe comprises a central section with a cavity filled with a heat transfer fluid, wherein the central section of the heat pipe is in longitudinal direction directly connected with a first end section on a first end of the central section and a second end section on the opposite second end of the central section, wherein the first end section and the second end section each comprise a landing structure with a surface length and a surface width and wherein each landing structure is thermoconductively coupled with the central section of the heat pipe;

and alternatively

-b- Providing at least one inner layer to position thereupon the said at least one heat pipe;

-c- Embedding the said at least one heat pipe by positioning at least one further inner layer flanking the at least one heat pipe and forming a recess in the shape of the outer contour of the said at least one heat pipe;

or

-b'- Providing at least one inner layer with a recess in the shape of the outer contour of the said at least one heat pipe;

-c'- Embedding the said at least one heat pipe in the recess; and furthermore

-d- Optionally attaching at least one further inner layer to cover the recess with the at least one embedded heat pipe;

-e- Attaching outside surface layers on the recess or on the outsides of the already attached further inner layers covering the cavity with the at least one embedded heat pipe;

-f- Laminating the at least one inner layer with the at least one embedded heat pipe and the attached outside surface layers to receive a first semi-finished product;

-g- Arranging at least one opening hole from an outside surface of at least one outside surface layer to contact each landing structure of the at least one embedded heat pipe;

-h- Connecting the outside surface layers with the landing structures by means of thermal vias that are arranged in at least one opening hole.

Within the indicated production method there are several alternatives and options included how to receive a component carrier according to the invention.

Regarding step -a- of the aforesaid inventive production method it is herewith made clear that the direct connection of the central section of the heat pipe with first and second end sections can be realised in different ways. For example a standard heat pipe that comprises a cavity can be taken as central section, whereby a first end section and a second end section that each comprise landing structures are for example attached to the central section either by an interlocking connection like a plug connection, or by a firmly bonded connection like a welded, glued or soldered connection. Alternatively a heat pipe according to the invention can be as if made from one piece, wherein for example the end sections that enlarge the central section in longitudinal direction are each made of the same material as used for the central section. For instance this material can be a solid metal material like solid copper as is the case of the wall material used in the central section to surround and encapsulate the filled cavity. Another possibility to design a heat pipe according the invention is to manufacture the both end sections as well as the central section in one piece. In these aforesaid cases landing structures that are arranged on the end sections can be made of solid copper and furthermore can either have the contour and outer shape of the central section, or the surface areas of the landing structures themselves can be enlarged by pressing or flatting these end sections accordingly.

Alternatively aforesaid steps -b- and -c- or steps -b'- and -c'- can be followed to receive a component carrier. According to aforesaid steps -b- and -c- and the first alternative route, at least one inner layer is provided to position thereupon the said at least one heat pipe. To avoid any displacement the heat pipe can be for example glued onto the inner layer that is used as carrier layer. Afterwards at least one further inner layer is arranged in a way next to the heat pipe that the further inner layer or layers is or are, respectively, flanking the heat pipe and that a recess is formed in the shape of the outer contour of the heat pipe. Thus the heat pipe is embedded in a recess within the inner layers of the component carrier.

According to aforesaid steps -b'- and -c'- and the second alternative route of manufacture, at least one inner layer with a recess in the shape of the outer contour of the said at least one heat pipe is provided and afterwards the heat pipe is embedded in this recess.

Regarding step -g- arranging at least one opening hole from an outside surface of at least one outside surface layer to contact each landing structure of the at least one embedded heat pipe can be made for example via mechanical drilling, milling and/or laser cutting. While by mechanical drilling usually a drill hole is formed as opening hole, via laser cutting also opening holes with more complex cross sections can be cut out.

Alternatively opening holes can also be manufactured for example via deep-routing.

Advantageously opening holes can also be cut out or opened, respectively, for example via 2.5D technology as developed by the applicant. In this case a release layer that is arranged between the embedded heat pipe and the at least one outside surface layer that has to be cut out prevents unwanted gluing of the respective layer on the below-positioned heat pipe and eases opening of the one or more cut-out layers that cover the heat pipe. Thus the cut-out section of the one or more layers can be opened like a plug. If the release layer has been positioned directly on at least a surface part of the heat pipe, the release layer may be peeled off the heat pipe after opening the cut-out layer section. Thus structural recesses and opening holes can be manufactured hyper-accurate. In this way also electronic components can also be directly inserted within the structural recesses and opening holes, respectively and can be directly mounted on the embedded heat pipe without the need of vias.

The indicated method is not restricted to the above-named steps. To receive for example a component carrier that is a finished printed circuit board, it might be necessary to arrange structured solder layers on the outer surfaces of the outside surface layers. Optionally the outer surfaces of a ready-made printed circuit board can also be finished by additional finishing steps that are well-known in the art.

According to a particularly convenient embodiment of the inventive method to produce a component carrier like an intermediate printed circuit board, opening holes from at least one outside surface layer to contact each landing structure of the said at least one embedded heat pipe can be manufactured via contact deep milling wherein the at least one embedded heat pipe is connected to an electrical circuit which is closed when a drilling device enters in contact with the embedded heat pipe to stop the drilling device.

Thus the landing structures or landing zones, respectively, can also be used to securely connect the heat pipe electrically via a so-called contact deep milling process. In this said process the heat pipe can be connected directly via a controlled drilling system. In this process, the embedded heat pipe has to be connected to an electrical circuit which is closed when a drilling device like a driller enters in contact with the outer surface of the embedded heat pipe. While drilling the PCB, when the drilling device touches the outside of the heat pipe, the drilling machine stops penetrating the PCB structure. This drilling process can be controlled with an accuracy of approximately 20 μm (micrometres) in depth and does not damage the heat pipe walls. This deep milling process opens several advantageous routes and possibilities to electrically connect the embedded heat pipe via a galvanic copper process with the electrical network of the PCB. By this convenient way of manufacture, the heat pipe can be directly connected to the outer PCB surface layer via galvanic copper vias.

In a further development of the invention it is also possible to bond landing structures to the structure of the heat pipe after the manufacturing process of the heat pipe or insert landing structures in the PCB and bond these landing structures to the structure of the heat pipe during the manufacturing process. For example the landing structures can also be made by attaching thermal conductive inlays like copper inlays or copper foils to the end sections of the heat pipe as well.

The aforesaid advantages of a heat pipe apply equivalently also for a component carrier like an intermediate printed circuit board product, an PCB or an IC-circuit, as well as for a method for producing such a component carrier according to the invention.

Other objects, advantages and novel features of the present invention will become more apparent from the following detailed description when taken in conjunction with the accompanying schematic drawings:

FIG. 1 refers to the known art and shows in a cross-sectional view a detail of a printed circuit board comprising a heat pipe that is partly connected to thermal vias;

FIG. 2 shows in a top view a detail of a first embodiment of a heat pipe according to the invention with a landing structure to easily contact thermal vias;

FIG. 3 shows in a cross-sectional side view the first embodiment of a heat pipe according to FIG. 2;

FIG. 4 depicts in a partial sectional side view a first embodiment of a component carrier, for example an intermediate printed circuit board, according to the invention with a heat pipe as shown in FIG. 3 embedded and with thermal vias already in place;

FIG. 9 shows in a cross-sectional side view a central section of a heat pipe with tangential adjoining landing structures;

FIG. 10 shows in a cross-sectional side view a central section of a heat pipe with radial protruding landing structures;

Figure 13:
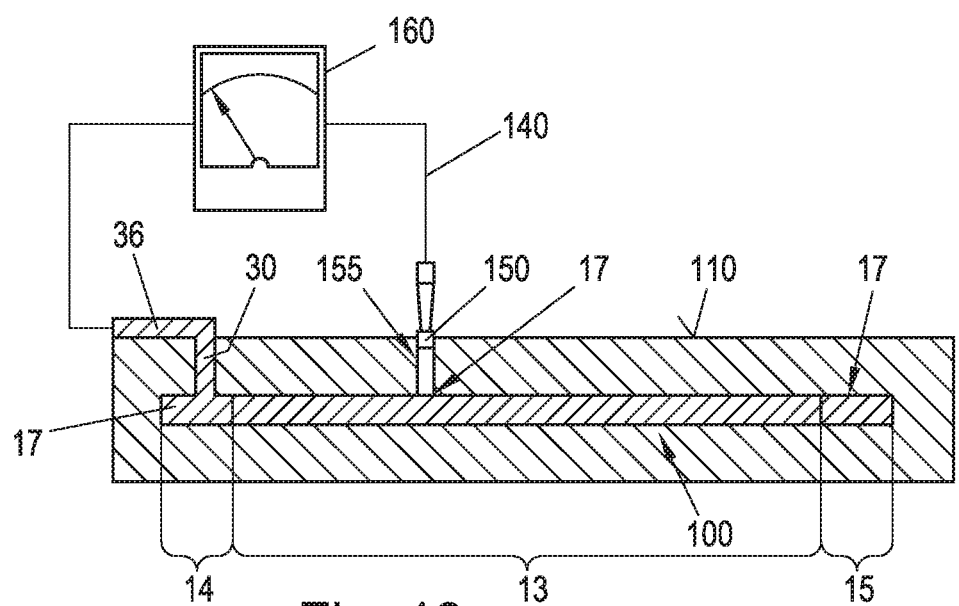
Figure 14:
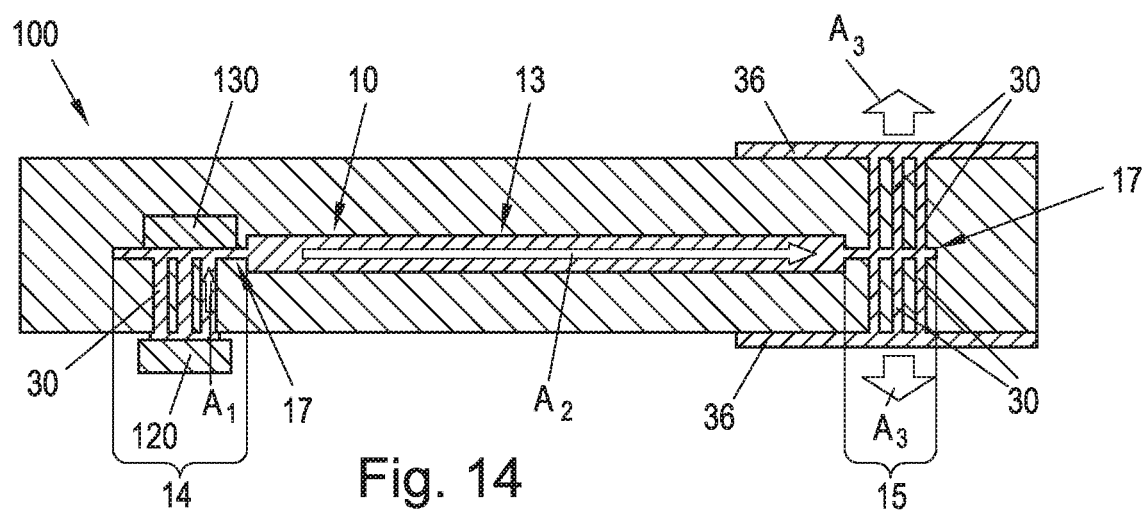
Figure 15:
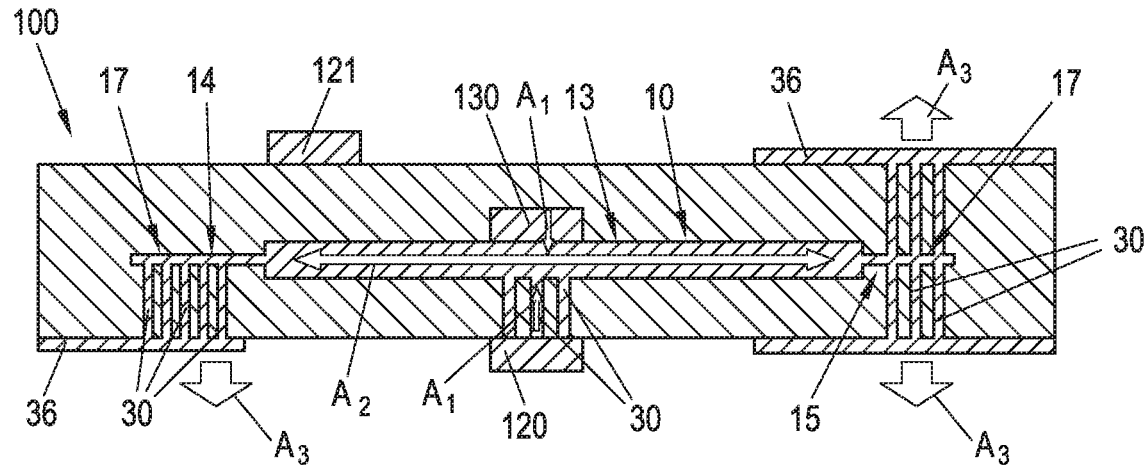

FIG. 11 displays in an aerial view a heat pipe with radial protruding landing structures on its end sections;

FIG. 12 displays in an aerial view a heat pipe with radial protruding landing structures on its end sections as well as on its central section;

FIG. 13 depicts the contact deep milling process to drill holes from the outside surface layer of an intermediate printed circuit board to contact landing structures of one embedded heat pipe;

FIG. 14 shows in a sectional side view another fourth embodiment of a component carrier according to the invention with a complex structure; and FIG. 15 depicts in a sectional side view another fifth complex embodiment of a component carrier according to the invention.

In FIG. 1 that refers to the known art a cross-section of a heat pipe 10 that is integrated within a printed circuit board 100 is shown. The printed circuit board 100 embodies a component carrier 100. The heat pipe 10 comprises a cavity 12 that is filled with a heat transfer fluid 20 like acetone or water. The heat pipe 10 has a cylindrical shape with a diameter D and a wall thickness W. The heat pipe 10 is manufactured for example of copper and is partly connected to thermal vias 30 that are here for example vias 32 filled with copper. The thermal vias 30 have a diameter T. As depicted in FIG. 1 the round and cylindrical, respectively, shape of the heat pipe 10 causes several problems for the connection with the thermal vias 30.

Hitting this structure of the heat pipe 10 for instance with a laser driller—which laser driller is not depicted—is difficult since the projected surface area of the heat pipe 10 seen from an outside surface layer 110 area of the printed circuit board 100 is small. Thus several thermal vias 30 will inevitably not be contacted and simply miss the surface of the heat pipe 10 in the manufacturing process.

In FIG. 1 the thermal via 30 on the upper left side of the figure contacts the heat pipe in the centre of the heat pipe 10. This thermal via 30 on the left properly contacts the outer surface of the heat pipe 10. Nevertheless, when one moves outwards the centre of the heat pipe 10 as shown in the case of the thermal via 30 on the upper right side of the figure, the contact surface of the heat pipe 10 with the thermal via 30 is minimized due to the geometrical effect of the cylindrical surface of the heat pipe 10. This inevitably results in bad thermal and electrical contacts as well as in weak mechanical stability of the contact between the copper filled via 32 and the heat pipe 10.

FIG. 2 shows in a top view a detail of a heat pipe 10 according to the invention. A central section 13 of the heat pipe 10 having a cylindrical profile 16 with a diameter D is connected with a first end section 14 of the heat pipe 10 having a landing structure 17 to easily contact thermal vias 30. The shown landing structure 17 is made up of a flattened and pressed end section of solid copper with a surface length SL, respectively $SL_1$, and a surface width SW, respectively $SW_1$, of the landing structure 17. As the landing structure 17 is arranged on the first end section 14, the surface length SL of this first end landing structure 17 is indicated also with reference sign $SL_1$. Vice versa is the surface width SW here also indicated with the respective reference sign $SW_1$ to indicate herewith unambiguously the surface width $SW_1$ of the first end landing structure 17. In FIG. 2 not shown is a respective second end section 15 of the heat pipe 10 on the opposite end in regard to the first end section 14.

FIG. 3 that shows in a cross-sectional side view the first embodiment of the heat pipe 10 along its longitudinal axis 11 according to FIG. 2 indicates also this second end section 15 of the heat pipe 10. Also the second end section 15 comprises a landing structure 17 that is made up of a flattened and pressed end section of solid copper with a surface length $SL_2$ and a surface width $SW_2$ of the respective landing structure 17. It can easily be seen in FIG. 2 that—compared with the known art of FIG. 1—by enlarging the landing structure 17 the feasibility to safely connect thermal vias 30 is significantly increased. As consequence thereof heat dissipation capacity of suchlike heat pipes 30 is improved and thermal conduction between thermal vias 30 and the heat pipe 10 is enhanced. In FIG. 3 it can be seen that the first 14 and second 15 end sections each comprising the landing structures 17 are flattened and have a reduced height h of the landing structure 17. The central section 13 of the heat pipe 14 that comprises a cavity 12 filled with a heat transfer fluid 20 has a total height H. As the central section 13 has a cylindrical profile 16 the total height H corresponds to the diameter D of the central section 13. The total length L of the heat pipe 10 along its longitudinal axis 11 corresponds to the sum of length of sections 13, 14 and 15 of the heat pipe 10.

FIG. 2 shows for easier understanding the thermal vias 30 already in place—evenly positioned on the landing structure 17. This enlarged landing structure 17 will also allow an easier aligning process for the laser drill, which in turn means a more efficient thermal and also electrical connection of the thermal vias 30 to the heat pipe 10.

FIG. 4 depicts in a partial sectional side view a first embodiment of a component carrier 100 like an intermediate printed circuit board 100 according to the invention with a heat pipe 10 as shown in FIG. 3 embedded and with thermal vias 30 already in place. As can be schematically seen the intermediate printed circuit board 100 comprises outside surface layers 110 forming its outer surfaces and several inner layers 111, 112 and 113. The intermediate printed circuit board 100 thus is a multilayer circuit board 100 wherein the pre-fabricated heat pipe 10 as shown in FIG. 3 has yet been embedded while manufacture of the intermediate printed circuit board 100. To receive a finished printed circuit board for example structured solder layers that preferably are arranged on the outer surfaces of the outside surface layers 110 are not yet applied. Optionally the outer surfaces of a ready-made printed circuit board are also finished which is also not the case for the shown intermediate printed circuit board 100.

In FIG. 4 a first electronic component 120 and a second electronic component 125 are schematically indicated each with dotted lines. The first electronic component 120 is arranged on the top outside surface layer 110 above the first end section 14 of the embedded heat pipe 10. The electronic component 120 which is a heat-emitting component 120 is contacted via several thermal vias 30—here with vias 32 filled with copper—to the flattened landing structure 17 of the first end section 14 of the heat pipe 10. Contact areas 36 that are arranged on the outside surface layers 110 between several thermal vias 30 enhance the convenience to electrically and thermally contact the respective electronic components 120, 125 with the thermal vias 30. The larger landing structure 17 will also allow an easier aligning process for the laser drill, which in turn means a more efficient thermal and/or electrical connection of the thermal vias 30 to the heat pipe 10. The cylindrical 16 central section 13 of the heat pipe 10 is connected directly to the flattened pieces of metal or copper, respectively, forming the landing structures 17. The landing structures 17 are directly contacted to the respective thermal vias 30, for example copper-filled vias 32 and/or plated through holes 34.

The flattened part of the landing structures 17 can be produced during the manufacturing process of the heat pipe 10 simply by pressing the copper cylinder and welding the parts after enclosing the heat transfer fluid 20, for example water. Alternatively the landing structures 17 can also be bonded to the structure of the heat pipe 10 after the manufacturing process or even be inserted in the PCB during the manufacturing process. For example the landing structures 17 can also be made by attaching thermal conductive inlays like copper inlays to the end sections of the heat pipe 10 as well.

In direction of the longitudinal axis 11 on the opposite end of the heat pipe 10 the second electronic component 125 is arranged on the bottom outside surface layer 110 of the intermediate printed circuit board 100. The bottom outside surface layer 110 is arranged on the opposite outside surface of the intermediate printed circuit board 100 in respect to the top outside surface layer 110. The second electronic component 125 which is a heat releasing component 125 is here contacted with thermal vias 30 to the landing structure 17 of the second end section 15 of the heat pipe 10. These thermal vias 30 are carried out as plated through holes 34. To cool the heat-dissipating electronic component 120 a heat input $A_1$ that is schematically indicated as arrow $A_1$ is conducted via the copper-filled vias 32 to the first end section 14 and further to the central section 13 of the heat pipe 10, wherein the heat is further conducted via the heat transfer fluid 20 within the cavity 12 in heat conduct direction $A_2$ to the second end section 15. At the second end section 15 the heat is conducted via the plated through holes 34 to the bottom outside surface layer 110 of the printed circuit board 100 and is then released via the electronic component 125 into the surroundings of the intermediate printed circuit board 100 which is indicated via an arrow $A_3$ representing the heat output $A_3$.

Figure 5:
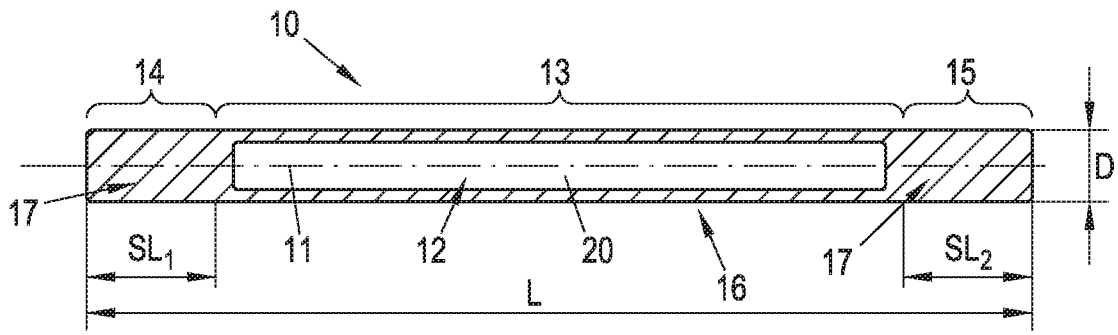
FIG. 5 shows in a cross-sectional side view a second embodiment of a heat pipe according to the invention.

FIG. 5 shows in a cross-sectional side view a second embodiment of a heat pipe 10 according to the invention. In this embodiment the first end section 14 and the second end section 15 of the heat pipe 10 both have the same cylindrical profiles 16 with a diameter D as is the case with the cylindrical central section 16. Advantageously the landing structures 17 of the first end section 14 and second end section 15, respectively, are lengthwise 11 extended and have surface lengths $SL_1$ and $SL_2$, respectively. The first end section 14 and the second end section 15 are both made of solid copper. Thus contacting of thermal vias within the landing structures 17 of the heat pipe 10 is easy and reliable. To illustrate the dimensions of this heat pipe 10 as shown in FIG. 5 the total length L of the heat pipe 10 is for example 890 mm, the surface lengths $SL_1$ and $SL_2$ of the respective landing structures 17 are approximately 10 mm and the diameter D of the heat pipe 10 is here 1.5 mm.

Figure 6:
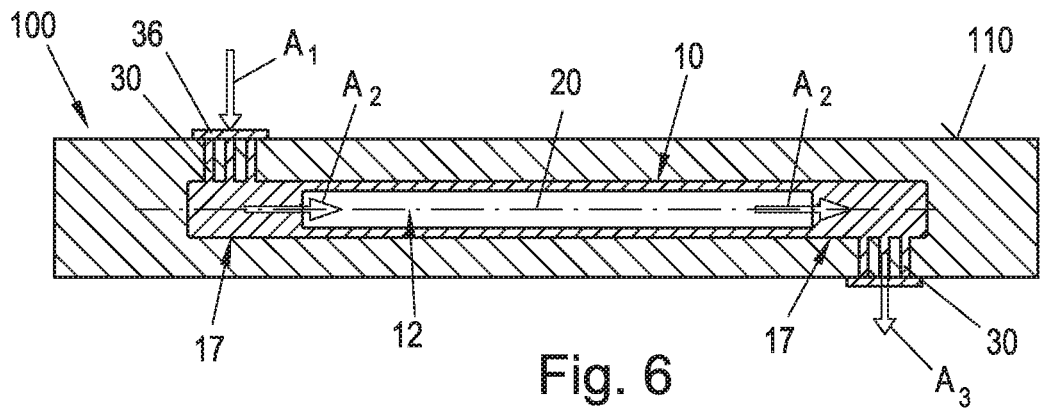
FIG. 6 depicts in a partial sectional side view a second embodiment of a component carrier, for example an intermediate printed circuit board, according to the invention with a heat pipe as shown in FIG. 5 embedded and with thermal vias already in place.

FIG. 6 illustrates in a partial sectional side view a second embodiment of a component carrier 100, an intermediate printed circuit board 100 according to the invention with a heat pipe 10 as shown in FIG. 5 embedded and with thermal vias 30 already in place. Due to the lengthwise extended landing structures 17 a proper thermal connection between the thermal vias 30 and the heat pipe 10 is ensured.

Figure 7:
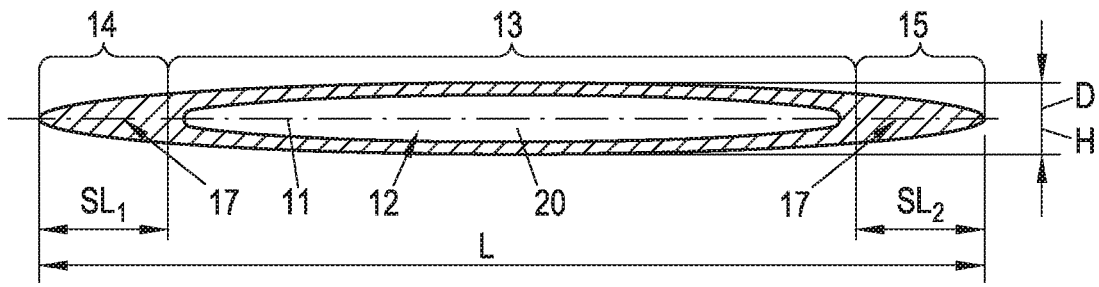
FIG. 7 shows in a cross-sectional side view a third embodiment of a heat pipe according to the invention.

FIG. 7 shows in a cross-sectional side view a third embodiment of a heat pipe 10 according to the invention. In this heat pipe embodiment the landing structures 17 of the first end section 14 and the second end section 15 each show a conically tapering headpiece. The first end section 14 and the second end section 15 both are made of solid copper.

Figure 8:
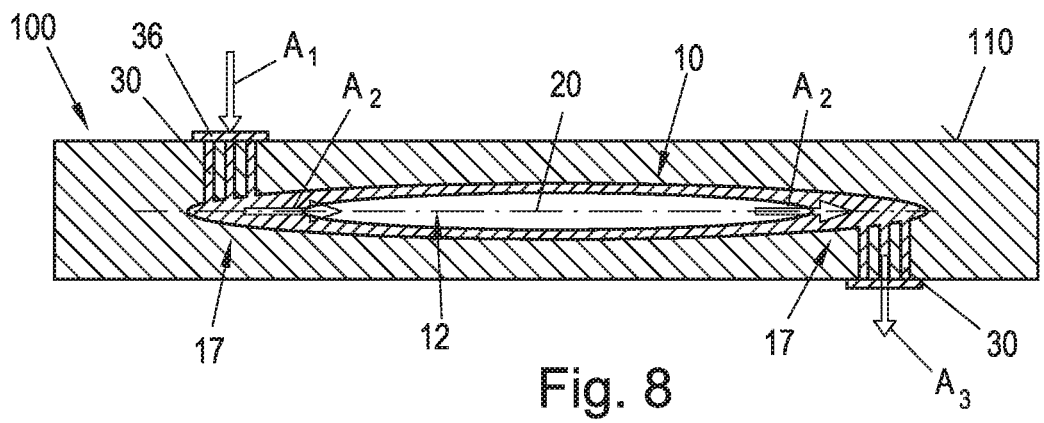
FIG. 8 depicts in a partial sectional side view a third embodiment of a component carrier, for example an intermediate printed circuit board, according to the invention with a heat pipe as shown in FIG. 7 embedded and with thermal vias already in place.

FIG. 8 depicts in a partial sectional side view a third embodiment of a component carrier 100, here an intermediate printed circuit board 100, according to the invention with a heat pipe 10 as shown in FIG. 7 embedded and with thermal vias 30 already in place. Due to the lengthwise extended landing structures 17 a proper thermal connection between the thermal vias 30 and the heat pipe 10 is ensured also in this embodiment. To illustrate the dimensions of this heat pipe 10 as shown in FIG. 8 the total length L of the heat pipe 10 is for example 900 mm, the surface lengths $SL_1$ and $SL_2$ of the respective landing structures 17 are approximately 20 mm and the diameter D of the heat pipe 10 is here 1.0 mm.

FIG. 9 shows in a cross-sectional side view a central section 13 of a heat pipe 10 with tangential adjoining landing structures 17 that enlarge the surface width SW and thus the surface area of the heat pipe 10.

FIG. 10 shows in a cross-sectional side view a central section 13 of a heat pipe 10 with radial protruding landing structures 17.

FIG. 11 displays in an aerial view a heat pipe 10 with radially protruding landing structures 17 that are attached on the first end section 14 as well as on the second end section 15.

FIG. 12 displays in an aerial view another heat pipe 10 according to the invention with radially protruding landing structures 17 on its end sections 14, 15 as well as on its central section 13.

FIG. 13 depicts the contact deep milling process to drill via a drilling device 150 opening holes 155—which are here drill holes 155—from the outside surface layer 110 of an intermediate printed circuit board 100 to contact landing structures 17 of one embedded heat pipe 10. In this said process the heat pipe 10 can be connected directly via a controlled drilling system. In this process, the embedded heat pipe 10 has to be connected to an electrical circuit 140 which is closed when a drilling device 150 like a driller enters in contact with the outer surface of the embedded heat pipe 10. While drilling the intermediate printed circuit board 100, when the drilling device 150 touches the outside of the heat pipe 10, the applied electric circuit 140 is closed which is indicated for example by an amperemeter 160. Thus the drilling device 150 immediately stops penetrating the PCB structure 100. This process can be controlled by a factor of approximately 20 μm (micrometres) in depth and does not damage the heat pipe 10 walls W. The embedded heat pipe 10 can afterwards be contacted via a galvanic copper process with the electrical network of the intermediate printed circuit board 100. By this convenient way of manufacture, the heat pipe 10 can be directly connected to the outside surface layer 110 of the intermediate printed circuit board 100 via galvanic copper vias 30 and contact areas 36, respectively.

FIG. 14 shows in a sectional side view another fourth embodiment of a component carrier 100 according to the invention. The component carrier 100 is here for example an intermediate printed circuit product 100 with a complex structure. A heat pipe 10 comparable to the one as shown in FIG. 11 is yet embedded and with thermal vias 30 already in place. An electronic component 120 is arranged on the bottom outside surface layer 110 of the component carrier 100 and is directly connected via thermal vias 30 with the landing structure 17 of the first end section 14 of the embedded heat pipe 10. The electronic component 120 which is a heat-emitting component 120 is contacted via several thermal vias 30 to the flattened landing structure 17 of the first end section 14 of the heat pipe 10. Another electronic component 130 which is also a heat-dissipating component is embedded within the component carrier 100 and is directly attached onto the landing structure 17 of the first end section 14. On the second end section 15 of the heat pipe 10 its landing structure 17 is connected via thermal vias 30 to contact areas 36 that are arranged on the top and bottom outside surfaces of the component carrier 100.

To cool the heat-dissipating electronic component 120, a heat input $A_1$ that is schematically indicated as arrow $A_1$ is conducted via the copper-filled vias 32 to the first end section 14 and further to the central section 13 of the heat pipe 10, wherein the heat is further conducted via the heat transfer fluid 20 within the cavity 12 in heat conduct direction $A_2$ to the second end section 15. Also the heat of the heat-emitting embedded electronic component 130 is transported in heat conduction direction $A_2$ from the heat-dissipating first end section 14 to the heat-releasing, cooler end section 15 of the heat pipe 10. At the second end section 15 the heat is conducted via plated through holes 34 to the bottom outside surface layer 110 of the printed circuit board 100 and is then released via the contact areas 36 into the surroundings of the intermediate printed circuit board 100 which is indicated via an arrow $A_3$ representing the heat output $A_3$.

FIG. 15 depicts in a sectional side view another fifth complex embodiment of a component carrier 100 according to the invention. The component carrier 100 is here for example an intermediate printed circuit product 100. A heat pipe 10 comparable to the one as shown in FIG. 12 is yet embedded and with thermal vias 30 already in place. An electronic component 120 is arranged on the bottom outside surface layer 110 of the component carrier 100 and is directly connected via thermal vias 30 with the landing structure 17 of the central section 13 of the embedded heat pipe 10. The electronic component 120 which is a heat-emitting component 120 is contacted via several thermal vias 30 to the central section 13. Another electronic component 130 which is also a heat-dissipating component is embedded within the component carrier 100 and is directly attached onto the landing structure 17 of the central section 13. On the first end section 14 as well as on the second end section 15 of the heat pipe 10 the respective landing structures 17 each are connected via thermal vias 30 to contact areas 36 that are arranged on the outside surfaces of the component carrier 100.

To cool the heat-dissipating electronic component 120, a heat input $A_1$ that is schematically indicated as arrow $A_1$ is conducted via for instance copper-filled vias 32 to the central section 13 and further from the central section 13 to both end sections 14, 15 of the heat pipe 10. Thus the emitted heat is further conducted via the heat transfer fluid 20 within the cavity 12 in heat conduct direction $A_2$—as marked with a double arrow $A_2$—to the first end section 14 and also to the second end section 15. Also the heat of the heat-emitting embedded electronic component 130 is transported in heat conduction direction $A_2$ from the heat-dissipating central section 13 to the heat-releasing, cooler end sections 14, 15 of the heat pipe 10. At the first end section 14 and second end section 15 the heat is conducted via plated through holes 34 to the bottom outside surface layer 110 of the printed circuit board 100 and is then released via contact areas 36 into the surroundings of the intermediate printed circuit board 100 which is indicated via arrows $A_3$ representing the heat output $A_3$. In this embodiment a heat-sensitive component 121 is positioned on the upper outside surface of the intermediate printed circuit board 100. Although this heat-sensitive component 121 is not directly connected to the heat pipe 10, the heat pipe 10 protects also this heat-sensitive component 121 from the off-heat produced by the heat-emitting embedded electronic component 130. Thus the heat pipe 10 works as a heat bus and conducts the off-heat of component 130 away to prevent heat build-up of the heat-sensitive component 121.

In FIG. 15 the thermal vias 30 of the first end section 14 on the left side of the picture contact the landing structure 17 on its surface. The thermal vias 30 of the second end section 15 on the right side of the picture pass through the landing structure 17.

LIST OF REFERENCE SIGNS 10 heat pipe
11 longitudinal axis
12 cavity
13 central section of heat pipe
14 first end section of heat pipe
15 second end section of heat pipe
16 cylindrical profile of central section
17 landing structure
20 heat transfer fluid
30 thermal via
32 via filled with metal (copper)
34 plated through hole
36 contact area
100 component carrier; (intermediate) printed circuit board; IC substrate
110 outside surface layer of printed circuit board
111 inner layer of printed circuit board (resp. 112, 113)
120 electronic component; heat-dissipating component
121 heat-sensitive component
125 electronic component; heat-releasing component
130 embedded component
140 closed electric circuit
150 drilling device, driller
155 opening hole, drill hole
160 amperemeter
$A_1$ heat input (arrow)
$A_2$ heat conduct (arrow)
$A_3$ heat output (arrow)
D diameter of heat pipe
H total height of heat pipe
h height of landing structure
L total length of heat pipe
SL surface length of landing structure (resp. $SL_1$, $SL_2$)
SW surface width of landing structure (resp. $SW_1$, $SW_2$)
T diameter of thermal via
W wall thickness of central section of heat pipe

The invention claimed is:

1. A heat pipe (10) for cooling an electronic device comprising:
    a central section (13) with a cavity (12) filled with a heat transfer fluid (20), wherein in a longitudinal direction (11) of the heat pipe (10) directly connected with the central section (13) are a first end section (14) on a first end of the central section (13) and a second end section (15) on the opposite second end of the central section (13),
    wherein the first end section (14) and the second end section (15) each comprise a landing structure (17) distal to the cavity and having a surface length (SL, $SL_1$, $SL_2$) and a surface width (SW, $SW_1$, $SW_2$),
    wherein each landing structure (17) is thermoconductively coupled with the central section (13) of the heat pipe (10),
    wherein each end section (14, 15) is made of flattened and pressed solid copper or solid copper alloy and has a greater width relative to the central section (13),
    wherein the heat pipe (10) is a single separate part configured to be embedded within a component carrier (100),
    wherein the heat pipe is already operational before being embedded within the component carrier (100),
    wherein the component carrier (100) is a printed circuit board, an intermediate printed circuit board product, or an IC-substrate, and
        wherein the first and second end sections are: (i) structures attached respectively to each of the first and second ends of the central section, or
        (ii) structures integrally formed with the central section, and wherein the heat pipe (10) is configured to be embedded within the component carrier (100) as an integral unit.

2. The heat pipe (10) of claim 1, wherein the at least one landing structure (17) adjoins or laterally protrudes along at least one of a longitudinal segment of the central section (13), the first end section (14), and the second end section (15).

3. The heat pipe (10) of claim 1, wherein at least one landing structure (17) is electrically coupled with the central section (13) of the heat pipe (10).

4. The heat pipe (10) of claim 1, wherein the first end section (14) or the second end section (15) is firmly bonded with the central section (13).

5. The heat pipe (10) of claim 1, wherein at least one of the central section (13), the first end section (14), and the second end section (15) has or have, respectively, a cylindrical profile (16) with an outer diameter (D) of the heat pipe (10).

6. The heat pipe (10) of claim 1, wherein at least one of the first end section (14) and the second end section (15) is or are, respectively, made of a solid metal.

7. The heat pipe (10) of claim 1, wherein a height (h) of the flattened landing structure (17) is smaller than a total height (H) or diameter (D) of the central section (13) of the heat pipe (10) and wherein the surface width (SW, $SW_1$, $SW_2$) of the flattened landing structure (17) is greater than the total height (H) or diameter (D) of the central section (13) of the heat pipe (10).

8. A component carrier (100) comprising at least one heat pipe (10) according to claim 1, wherein the at least one heat pipe (10) is embedded within at least one inner layer (111, 112, 113) of the component carrier (100), which at least one inner layer (111, 112, 113) is arranged between outside surface layers (110) forming the outside surface of the component carrier (100), and wherein each landing structure (17) of the embedded heat pipe (10) is thermoconductively coupled ($A_1$, $A_2$, $A_3$) by means of at least one thermal via (30) to at least one outside surface of an outside surface layer (110) of the component carrier (100).

9. The component carrier (100) of claim 8, wherein at least one thermal via (30) contacts a landing structure (17) on its surface or ends within the landing structure (17) or passes through the landing structure (17).

10. The component carrier (100) of claim 8, wherein each landing structure (17) is electrically coupled or galvanically coupled by means of at least one thermal via (30) to at least one outside surface of an outside surface layer (110).

11. The component carrier (100) of claim 8, further comprising at least one heat-dissipating component (120, 130) and at least one heat-releasing component (125, 36), wherein the at least one heat-dissipating component (120) is mounted on an outside surface layer (110) or is embedded (130) within at least one inner layer (111, 112, 113) and contacted directly or by means of at least one thermal via (30) to at least one of a landing structure (17) of the first end section (14), the central section (13), and the second end section (15) of the embedded heat pipe (10) and wherein a landing structure (17) of at least one of the first end section (14), the central section (13) and the second end section (15) of the heat pipe (10) is contacted directly or by means of at least one thermal via (30) to the at least one heat-releasing component (125, 36) which is mounted on an outside surface layer (110) or embedded within at least one inner layer (111, 112, 113).

12. The component carrier (100) of claim 11, wherein the at least one heat-dissipating component (120, 130) is contacted directly or by means of at least one thermal via (30) to a landing structure (17) of the central section (13) of the embedded heat pipe (10) and wherein heat releasing components (125, 36) are contacted by means of thermal vias (30) to landing structures (17) of at least one of the first end section (14) and second end section (15) of the heat pipe (10).

13. The heat pipe of claim 1, wherein the first end section, second end section, and central section are manufactured in one piece such that the first and second end sections are integrally formed with the central section.

14. The heat pipe of claim 13, wherein the central section is cylindrical.

15. The heat pipe of claim 14, wherein each of the first and second end sections is cylindrical.

16. The heat pipe of claim 13, wherein each of the first and second end sections comprises a conically tapered headpiece.

17. The heat pipe of claim 1, wherein the first and second end sections are attached respectively to the first and second ends of the central section by an interlocking connection or a bonded connection, which are selected from a plug connection, welding, gluing, or soldering.

18. The heat pipe of claim 1, wherein the central section has a diameter of less than 1 mm.

19. The heat pipe (10) of claim 1, wherein the central section (13) has a cylindrical profile.

20. An electronic component assembly comprising:
a component carrier selected from a printed circuit board (PCB), an intermediate PCB, and an IC-substrate;
one or more heat pipes embedded in the component carrier, wherein at least one of the heat pipes comprises (i) a central section with a cavity filled with a heat transfer fluid, (ii) a first end section on a first end of the central section, and (iii) a second end section on the opposite second end of the central section, wherein the first and second end sections each comprises a landing structure integrally formed with, and thermoconductively coupled to, the central section, wherein the first end section, second end section, and central section are manufactured in one piece such that the first and second end sections are integrally formed with the central section, wherein each end section is made of flattened and pressed solid copper or solid copper alloy and has a greater width relative to the central section, wherein each of the one or more heat pipes is a single separate part configured to be embedded in the component carrier as an integral unit, and wherein each of the one or more heat pipes is already operational before being embedded within the component carrier; and
at least one thermal via extending into the component carrier and thermoconductively coupled to one of the landing structures and to at least one heat dissipating component.

21. A heat pipe (10) for cooling an electronic device comprising:
a central section (13) with a cavity (12) filled with a heat transfer fluid (20), wherein in a longitudinal direction (11) of the heat pipe (10) directly connected with the central section (13) are a first end section (14) on a first end of the central section (13) and a second end section (15) on an opposed second end of the central section (13),
wherein the first end section (14) and the second end section (15) each comprise a landing structure (17) distal to the cavity and having a surface length (SL, $SL_1$, $SL_2$) and a surface width (SW, $SW_1$, $SW_2$),
wherein each landing structure (17) is thermoconductively coupled with the central section (13) of the heat pipe (10), wherein each end section (14, 15) is made of flattened and pressed solid copper or solid copper alloy and has a greater width relative to the central section, wherein the first end section, second end section, and central section are manufactured in one piece such that the first and second end sections are structures integrally formed with the central section, wherein the heat pipe (10) is a single separate part configured to be embedded within a component carrier (100) as an integral unit, and wherein the heat pipe (10) is already operational before being embedded within the component carrier (100).

\* \* \* \* \*